(12) United States Patent
Jeep et al.

(10) Patent No.: US 9,641,171 B2
(45) Date of Patent: May 2, 2017

(54) LARGE-RANGE INPUT CIRCUIT

(71) Applicant: Phoenix Contact GmbH & Co. KG, Blomberg (DE)

(72) Inventors: Benjamin Jeep, Lemgo (DE); Winfried Thuer, Steinheim (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 15/113,789

(22) PCT Filed: Feb. 4, 2015

(86) PCT No.: PCT/EP2015/052313
§ 371 (c)(1),
(2) Date: Jul. 22, 2016

(87) PCT Pub. No.: WO2015/118017
PCT Pub. Date: Aug. 13, 2015

(65) Prior Publication Data
US 2016/0336938 A1    Nov. 17, 2016

(30) Foreign Application Priority Data

Feb. 4, 2014   (DE) ........................ 10 2014 101 353

(51) Int. Cl.
| | | |
|---|---|---|
| *H03K 17/79* | (2006.01) | |
| *H03K 17/795* | (2006.01) | |
| *H03K 17/30* | (2006.01) | |

(52) U.S. Cl.
CPC ......... *H03K 17/7955* (2013.01); *H03K 17/30* (2013.01)

(58) Field of Classification Search
CPC ..... H03K 17/30; H03K 17/78; H03K 17/7955
See application file for complete search history.

(56) References Cited

U.S. PATENT DOCUMENTS

| | | | | |
|---|---|---|---|---|
| 3,725,665 A | * | 4/1973 | Talmo ................. | G01F 15/0755 250/205 |
| 4,139,878 A | * | 2/1979 | Shuey .................... | H02H 3/083 250/551 |

(Continued)

FOREIGN PATENT DOCUMENTS

| | | |
|---|---|---|
| DE | 102010030656 A1 | 12/2011 |
| EP | 2509178 A1 | 10/2012 |
| JP | 2005039905 A | 2/2005 |

OTHER PUBLICATIONS

Authorized Officer: Nora Lindner, English Translation of the "International Preliminary Report on Patentability" issued in counterpart PCT Application No. PCT/EP2015/052313, dated Aug. 9, 2016, Publisher: PCT, Published in: WO.

(Continued)

*Primary Examiner* — Thomas J Hiltunen
(74) *Attorney, Agent, or Firm* — Kaplan Breyer Schwarz & Ottesen, LLP

(57) ABSTRACT

Disclosed is a large-range input circuit for digital signals in the range of extra-low voltage signals of ≤120 V and in the range of low voltage signals of <1500 V, said input circuit comprising series-connected Zener diodes that are polarized in the reverse direction, each one defining at least one switching threshold in the range of the extra-low voltage signals or in the range of the low voltage signals, and can be selected to be active by not being bridged, wherein a respective auxiliary optocoupler, which can be controlled by a microprocessor, is used to bridge the inactive Zener diode.

8 Claims, 2 Drawing Sheets

(56) References Cited

U.S. PATENT DOCUMENTS

| | | | | |
|---|---|---|---|---|
| 4,247,849 A | * | 1/1981 | Morris | G01R 19/16519 |
| | | | | 324/126 |
| 4,275,307 A | * | 6/1981 | Struger | H03K 17/94 |
| | | | | 250/551 |
| 4,682,061 A | | 7/1987 | Donovan | |
| 5,014,156 A | * | 5/1991 | Bruch | H02H 9/008 |
| | | | | 361/104 |
| 5,239,209 A | * | 8/1993 | Hockman | G08G 1/042 |
| | | | | 327/451 |
| 5,802,151 A | * | 9/1998 | Bevill, Jr. | H04M 11/06 |
| | | | | 375/222 |
| 5,859,592 A | * | 1/1999 | Carlin | H03K 17/18 |
| | | | | 340/635 |
| 6,404,609 B1 | * | 6/2002 | Mansfield | H03K 17/08146 |
| | | | | 361/103 |
| 8,570,770 B2 | * | 10/2013 | Eisenbeis | G01R 15/22 |
| | | | | 315/291 |
| 9,345,087 B2 | * | 5/2016 | Yu | H05B 33/083 |

OTHER PUBLICATIONS

Examiner: Bernd Seibert, "Office Action" issued in counterpart German Patent Application No. 10214101353.0, dated Apr. 30, 2014, Published in: DE.

Authorized Officer: Susanne Wingenfeld, "International Search Report" issued in counterpart PCT Application No. PCT/EP2015/052313, dated Apr. 15, 2015, Publisher: PCT.

\* cited by examiner

LARGE-RANGE INPUT CIRCUIT

FIELD OF THE INVENTION

The invention relates to a large-range input circuit for processing and forwarding digital signals which may be applied at input terminals with values both in the range of extra-low voltage signals of ≤120 V and in the range of low voltage signals of <1500 V.

BACKGROUND OF THE INVENTION

In industrial plants, digital control systems are often connected to sensors via an interface system. Type and voltage level of the sensor signals cover a large range. Therefore, the interface system between the sensors and the digital control system of the relevant device has to be capable of adapting the respective input signal to the digital input of the control system of the respective device.

From DE 10 2010 030 656 A1 a circuit arrangement for a digital input of an electronic device is known, in which a Zener diode is provided as a blocking element for blocking current flow below a switching threshold of an input voltage. A drawback therein is that only one switching threshold can be implemented.

U.S. Pat. No. 4,275,307 discloses an input circuit for a digital system, comprising: a rectifier circuit having a pair of AC input terminals and a pair of output terminals; a series circuit connected to the output terminals of the rectifier circuit wherein the series circuit compress the following elements: a current limiting circuit which limits the current flowing in the series circuit to a preselected maximum value; a plurality of series-connected Zener diodes having terminals which enable the Zener diodes to be selectively shorted in order to alter the voltage drop across the series circuit; and a light emitting element which forms part of a photo coupler, for generating an electrical signal in a light sensing portion of the photo coupler when current flows in the series circuit; wherein an output drive circuit is connected to the light sensing element to convert the generated signal into a logic level signal at the output terminal which is suitable for being applied to a data bus of the digital system. More specifically, three Zener diodes with Zener voltage levels of 3 volts, 7 volts, and 20 volt are employed, which can be bridged by bypass lines so that voltage drops of 0, 3, 7, 10, 20, 23, 27, and 30 volts can be set. In this way, the output signal can be brought to a logic level suitable for being applied to the data bus of a digital control system. The known input circuit only allows to implement a fixed setting of the switching threshold in the range of extra-low voltage signals.

The invention is based on the object to provide a large-range input circuit for digital signals which may be in the range of extra-low voltage signals of ≤120 V and/or in the range of low voltage signals of <1500 V and which are to be forwarded to a user circuit after having been processed. It is intended to provide for flexible setting, i.e. by means of software, of switching thresholds in the range of extra-low voltage signals of less than 120 V as well as in the range of low voltage signals of less than 1500 V. In particular it should be possible to quickly set standard switching thresholds.

SUMMARY OF THE INVENTION

The large-range input circuit of the invention comprises a series circuit including the following elements: an input-side rectifier or rectifier circuit for converting incoming digital ac signals into dc currents and to allow for a DC current through the series circuit between two input terminals; a current regulator for adjusting the DC current; two or a plurality n of series-connected reverse-biased Zener diodes; and an optocoupler for determining the state of the digital output terminal of the large-range input circuit; wherein additionally one or more bridging means for the Zener diodes are provided, which can be enabled or disabled by a microprocessor controller in order to insert the series-connected Zener diodes into the circuit, individually or in groups, or to disable them by bridging same.

This large-range input circuit permits to easily implement a plurality of switching thresholds even for different voltage ranges. The large-range input circuit can be operated with standard switching thresholds in the extra-low voltage range, and also with the standard switching thresholds applicable in the low voltage range. Parameterization of the switching threshold is effected depending on the respective different application areas.

BRIEF DESCRIPTION OF THE DRAWINGS

Exemplary embodiments of the invention will now be described with reference to the drawings, wherein.

DETAILED DESCRIPTION

Figure 1:
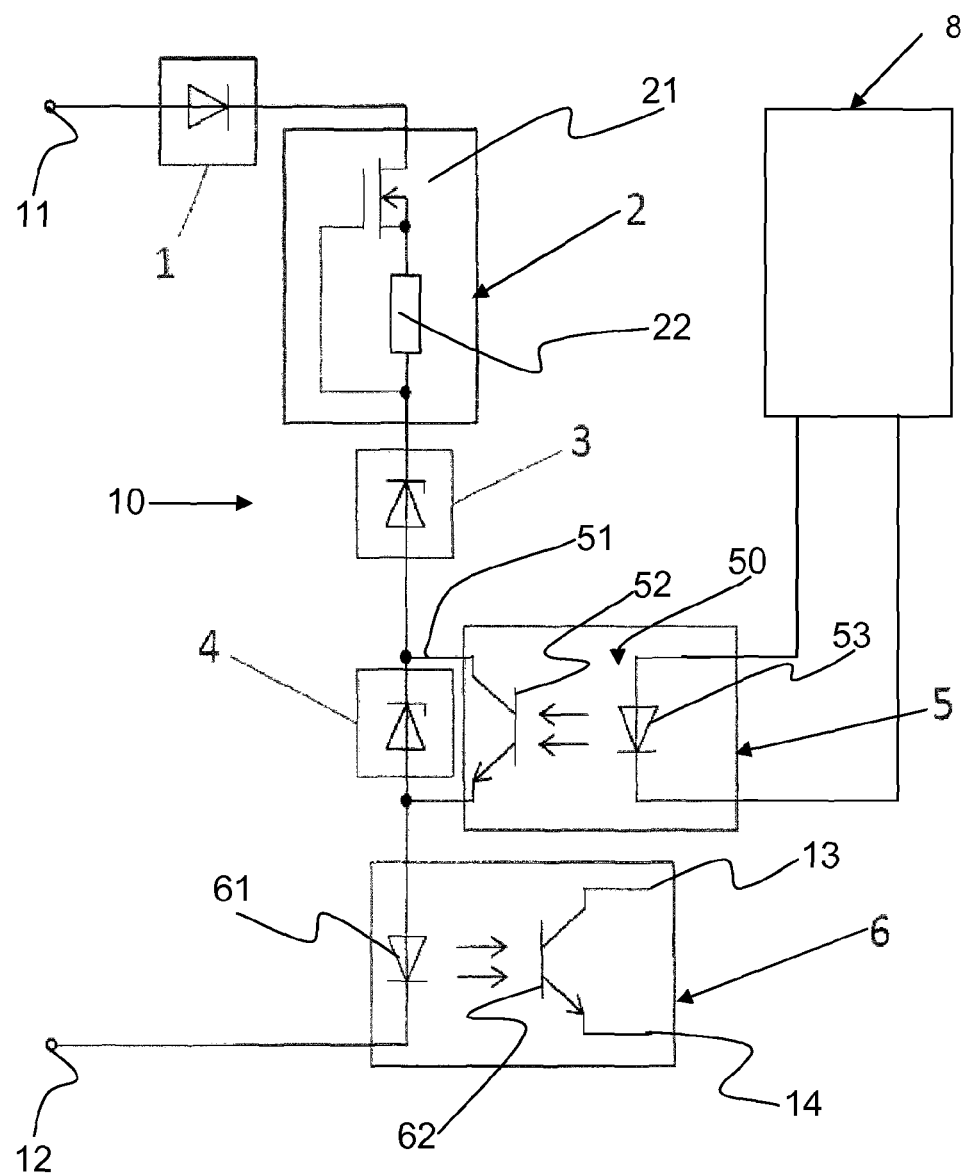
FIG. 1 shows a first embodiment of a large-range input circuit.

FIG. 1 shows a schematic diagram of the large-range input circuit. A signal input comprises two input terminals 11 and 12, and a digital output comprises two output connection lines 13, 14. A series circuit 10 is connected across input terminals 11, 12 and comprises the following elements: a rectifier 1 which may also be implemented as a rectifier circuit, a current regulator 2 which functions as a current source and supplies DC current for series circuit 10, a first reverse-biased Zener diode 3 for a switching threshold within the range of extra-low voltage signals of ≤120 V, a second reverse-biased Zener diode 4 for a switching threshold within the range of low voltage signals of <1500 V, a bypass circuit 5 for Zener diode 4, and a readout optocoupler 6 which is connected, via output connection lines 13, 14, to a user circuit not shown herein.

Bypass circuit 5 comprises a bypass line 51 and an auxiliary optocoupler 50 which includes a phototransistor 52 and a light emitting diode 53 and is controlled by a microprocessor 8 to drive the bypass line 51 and the phototransistor arranged therein to become conductive or non-conductive.

Readout optocoupler 6 comprises a light emitting diode (LED) 61 and a phototransistor 62 for converting the lighting state "light-emitting" or "not light-emitting" of LED 61 into a digital output signal at output connection lines 13, 14.

Current regulator 2 is used for adjusting the current that flows through series circuit 10 to a value that is required for operating light-emitting diode 61, and in the illustrated exemplary embodiment it comprises a self-conducting n-channel MOSFET 21 and a 750Ω resistor 22 between gate terminal and source terminal in order to adjust the current to about 0.75 mA. The maximum allowable drain-source voltage is for example 500 V, which defines the maximum allowable voltage at input terminals 11, 12. However, current regulator 2 may as well be designed for higher voltages if it is intended to fully exploit the low voltage signal range of <1500 V.

Assuming that the large-range input circuit is intended for digitally detecting both a nominal voltage of 24 V (=extra-low voltage) and a nominal voltage of 230 V (=low voltage). Rectifier 1 ensures that both AC voltage signals and DC voltage signals can be detected. For a nominal voltage of 24 VDC, the transition region given by the standard between a logical 0 and a logical 1 is between 5 V and 15 V, and for a nominal voltage of 230 VAC between 40 V and 164 V. Zener diode 3 is responsible for establishing the switching threshold for the range of extra-low voltage signals and is selected for a Zener voltage of 5.6 V. If signals in the range of extra-low voltage signals of ≤120 V are to be expected, bypass circuit 5 is enabled in order to bridge Zener diode 4, which is done by means of auxiliary optocoupler 50 that is controlled by microprocessor 8. For example, input signals below 5 V are detected as a digital signal "0", and input signals above 15 V are detected as a digital signal "1".

If input signals in the range of low voltage signals of <1500 V are expected, bypass circuit 5 is disabled, so that both Zener diodes 3 and 4 are subjected to incoming voltage-current pulses. If a nominal voltage of 230 V of the input signal is to be expected, then the transition region as specified by the standard between a logical 0 and a logical 1 is between 40 V and 164 V. In this case, the Zener voltage of Zener diode 4 is chosen to be 56 V.

As an optocoupler, the SFH 6156 of SIEMENS can be employed, for example. The peculiarity hereof is that the user can control this optocoupler, for example by means of microprocessor 8, while the nominal voltage of 230 VAC can be handled without risk for the user. Despite of the high hazardous voltage of 230 VAC, electrical safety is ensured.

Within the range of extra-low voltage signals of <120 V, the input voltage may also be a nominal voltage other than 24 V, e.g. 48 VDC. In this case, a transition range is from 10 to 34 V within which the switching threshold may take any voltage value. The Zener voltage of Zener diode 3 is chosen so as to be included in this transition region.

The illustrated circuit may be expanded to comprise more than two Zener diodes, if more than two switching thresholds are to be provided. In this case, a plurality n of series-connected reverse-biased Zener diodes 3, 4 and a plurality n or n−1 of bypass circuits 5 are incorporated in the series circuit 10.

Figure 2:
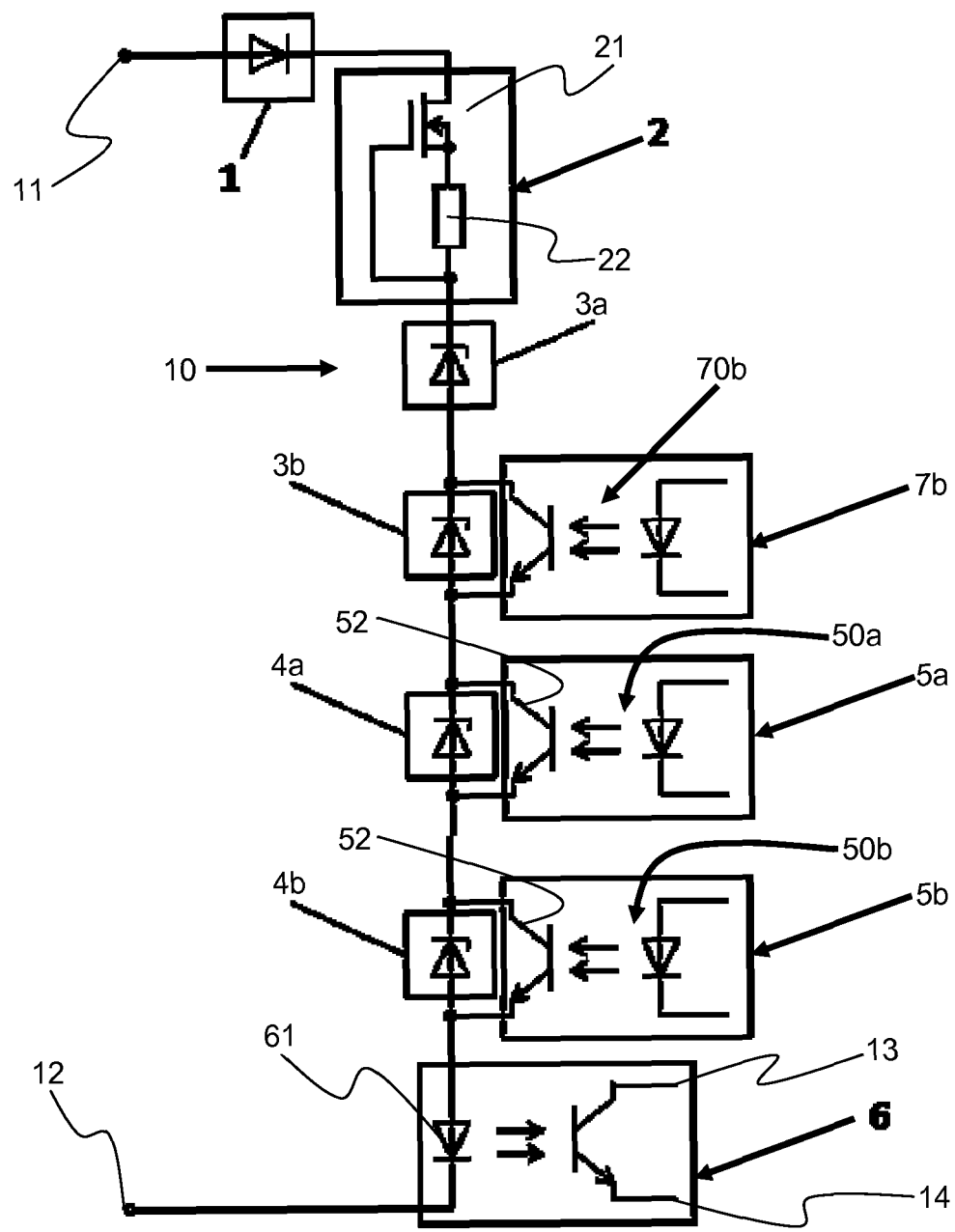
FIG. 2 shows a second embodiment of a large-range input circuit.

FIG. 2 shows a series circuit of the large-range input circuit comprising two reverse-biased Zener diodes 3a, 3b for two switching thresholds in the range of extra-low voltage signals of ≤120 V and two reverse-biased Zener diodes 4a, 4b for two switching thresholds in the range of low voltage signals of <1500 V, with circuit features otherwise corresponding to FIG. 1. Zener diode 3b can be bridged by a bypass circuit 7b which may be enabled by means of auxiliary optocoupler 70b. This allows to select a further switching threshold in addition to the switching threshold of Zener diode 3a. As in the case of FIG. 1, the optocouplers are driven "conductive" or "non-conductive" by a microprocessor controller which is not shown in FIG. 2 for the sake of lucidity.

It is also possible for Zener diode 3a to be shorted by a bypass circuit ("7a", not shown) to alternately enable Zener diode 3a or Zener diode 3b in order to provide a third switching threshold for the range of extra-low voltage signals.

Similar considerations apply to the range of low voltage signals. Here, likewise, the series-connected Zener diodes 4a, 4b may be used to establish switching thresholds of different levels. Since the auxiliary optocoupler 70b, 50a, 50b associated with the respective bypass circuits 7b, 5a, 5b can be driven by an appropriate microprocessor (not shown) corresponding to microprocessor 8, different switching thresholds can be set quickly and easily.

It will be understood that the number of reverse-biased and bridgeable Zener diodes can be chosen so that a desired number of switching thresholds is realized.

The invention thus relates to a large-range input circuit for digital signals in the range of extra-low voltage signals of ≤120 V and in the range of low voltage signals of <1500 V, which input circuit comprises series-connected reverse-biased Zener diodes, each of which defines at least one switching threshold in the range of extra-low voltage signals or in the range of low-voltage signals and which are selectable to be active by not being bridged, and wherein the bridging of a respective Zener diode for rendering same inactive is accomplished using a respective auxiliary optocoupler which can be controlled by a microprocessor.

What is claimed is:

1. A large-range input circuit for processing and forwarding digital signals which may be applied at input terminals with values both in the range of extra-low voltage signals of ≤120 V and in the range of low voltage signals of <1500 V, said input circuit comprising a series circuit including the following elements:
   an input-side rectifier or an input-side rectifier circuit for converting incoming digital alternating current signals into direct current signals;
   a current regulator designed for managing both extra-low voltage signals of ≤120 V and low voltage signals of <1500 V for adjusting the current flowing through the series circuit to a predetermined value;
   a first series-connected reverse-biased Zener diode which is designed for a switching threshold of ≤120 V within the range of extra-low voltage signals;
   a second series-connected reverse-biased Zener diode which is designed along with the first Zener diode for a switching threshold of <1500 V within the range of low voltage signals;
   a bypass circuit for bridging the second Zener diode, which includes an auxiliary optocoupler; and
   a readout optocoupler for forwarding the processed digital signals to a user circuit via output connection lines;
   wherein a microprocessor controller is provided for controlling the auxiliary optocoupler in order to control the second Zener diode in terms of being bridged or not bridged in dependence on whether input signals are to be expected in the range of extra-low voltage signals or in the range of low voltage signals;
   wherein furthermore, if a digital extra-low voltage signal is applied, the second Zener diode is bridged and the first Zener diode determines, by a "conductive" or "blocking" state thereof, whether a digital signal "1" or "0" is output; and
   if a digital low voltage signal is applied, at least the second Zener diode is not bridged, or the first and second Zener diodes remain connected in series and the non-bridged second Zener diode or the series-connected Zener diodes including the first and second Zener diodes determine, by a "conductive" or "blocking" state thereof, whether a digital signal "1" or "0" is output.

2. The large-range input circuit as claimed in claim 1, comprising a plurality n of series-connected reverse-biased Zener diodes and a plurality n or n−1 of bypass circuits with auxiliary optocouplers for said Zener diodes, which can be driven by said microprocessor controller to implement further switching thresholds within said range of extra-low voltage signals and/or said range of low voltage signals.

3. The large-range input circuit as claimed in claim 2, wherein n=4, and wherein two reverse-biased Zener diodes are provided for the range of extra-low voltage signals and additionally two further reverse-biased Zener diodes are provided for the range of low voltage signals.

4. The large-range input circuit as claimed in claim 3, wherein one of the Zener diodes which is responsible for the range of extra-low voltage signals is bridged by a bypass circuit; and wherein each of the two Zener diodes which are responsible for the range of low voltage signals are bridged by a respective bypass circuit.

5. The large-range input circuit as claimed in claim 1, wherein at a nominal voltage of 24 V within the range of extra-low voltage signals, a transition region between a logical "0" and a logical "1" is at a switching threshold of the first Zener diode between 5 and 15 V.

6. The large-range input circuit as claimed in claim 5, wherein the first Zener diode has a switching threshold at 5.6 V.

7. The large-range input circuit as claimed in claim 1, wherein at a nominal voltage of 230 V within the range of low voltage signals, a transition region between a logical "0" and a logical "1" is at a switching threshold of the series-connected Zener diodes between 40 V and 164 V.

8. The large-range input circuit as claimed in claim 7, wherein the second Zener diode of the series-connected Zener diodes has a switching threshold at 56 V.

* * * * *